United States Patent
Lin et al.

(10) Patent No.: US 9,704,901 B2
(45) Date of Patent: Jul. 11, 2017

(54) SOLID-STATE IMAGING DEVICES

(71) Applicant: VisEra Technologies Company Limited, Hsin-Chu (TW)

(72) Inventors: Chi-Han Lin, Zhubei (TW); Cheng-Yang Wei, Miaoli County (TW); Hao-Min Chen, Chiayi (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/599,139

(22) Filed: Jan. 16, 2015

(65) Prior Publication Data
US 2016/0211294 A1  Jul. 21, 2016

(51) Int. Cl.
*H01L 29/49* (2006.01)
*H01L 27/146* (2006.01)

(52) U.S. Cl.
CPC .... *H01L 27/14621* (2013.01); *H01L 27/1464* (2013.01); *H01L 27/14623* (2013.01); *H01L 27/14627* (2013.01)

(58) Field of Classification Search
CPC ......... H01L 27/14621; H01L 27/14623; H01L 27/14627
See application file for complete search history.

(56) References Cited

U.S. PATENT DOCUMENTS

2013/0293751 A1  11/2013  Vaartstra et al.

FOREIGN PATENT DOCUMENTS

| JP | 06-053455 | 2/1994 |
|---|---|---|
| JP | 07-176708 A | 7/1995 |
| JP | 09-116127 A | 5/1997 |
| JP | 2008192771 A | 8/2008 |
| JP | 2011-077410 | 4/2011 |
| JP | 2012-015283 A | 1/2012 |
| JP | 2013-038266 A | 2/2013 |
| JP | 2014-011239 A | 1/2014 |
| JP | 2014225667 A | 12/2014 |
| JP | 2015002340 A | 1/2015 |
| TW | 200612472 | 4/2006 |
| TW | 201203527 A | 1/2012 |

OTHER PUBLICATIONS

Taiwanese Office Action dated Aug. 22, 2016 in Application No. 104129119; pp. 1-8.
Office Action mailed Nov. 29, 2016 in corresponding JP Application 2015-176554, and English translation thereof.

*Primary Examiner* — Michael Shingleton
(74) *Attorney, Agent, or Firm* — Muncy, Geissler, Olds & Lowe, P.C.

(57) ABSTRACT

A solid-state imaging device is provided. The solid-state imaging device includes a semiconductor substrate containing a plurality of photoelectric conversion elements. A color filter layer includes a first color filter component and a second color filter component separated from each other and disposed above the semiconductor substrate. A microlens structure includes a first microlens element and a second microlens element separated from each other and disposed on the first and second color filter components respectively. The solid-state imaging device also includes a gap filled with air. The gap is disposed between the first and second color filter components and also between the first and second microlens elements.

19 Claims, 3 Drawing Sheets

SOLID-STATE IMAGING DEVICES

BACKGROUND OF THE INVENTION

Field of the Invention

The invention relates to imaging devices, and more particularly to solid-state imaging devices having a gap array in a color filter layer and a microlens structure.

Description of the Related Art

Recently, solid-state imaging devices have been widely used in various imaging-capturing apparatuses, for example video cameras, digital cameras and the like. Solid-state imaging devices, such as charge-coupled device (CCD) imaging sensors or complementary metal-oxide semiconductor (CMOS) imaging sensors, have photoelectric converters for converting incident light into electric signals, and they have logic circuits for transmitting and processing the electric signals. The solid-state imaging devices have a pixel array and each pixel has one photoelectric converter.

Solid-state imaging devices usually have a color filter for generating color imagings. The color filter may be a primary-color filter of red (R), blue (B) and green (G) segments stacked over the light-receiving surface of two-dimensionally arranged photoelectric converters. The color filter has a predetermined pattern such that each of the color segment corresponds to one photoelectric converter. Generally, the red (R), blue (B) and green (G) segments are connected with each other to form a connected color filter profile.

In addition, solid-state imaging devices have a microlens structure on the color filter for collecting light to the photoelectric converters. The microlens structure has a plurality of microlenses arranged into an array and the microlenses are connected with each other to form a connected microlens structure profile. In the connected color filter profile, light diagonally entering one color segment will pass through the color segment to reach an adjacent color segment and be lost in the color segment. Thus, the quantum efficiency (QE) of the solid-state imaging devices having the connected color filter profile cannot be enhanced.

BRIEF SUMMARY OF THE INVENTION

According to embodiments of the disclosure, a gap array is disposed in both a color filter layer and a microlens structure of solid-state imaging devices. The color filter layer has a plurality of color filter components separated from each other by the gap array. The microlens structure has a plurality of microlens elements separated from each other by the same gap array. The quantum efficiency (QE) of the solid-state imaging devices is enhanced by disposing the gap array between the color filter components. Moreover, the fabrication cost of the solid-state imaging devices is reduced by fabricating the separated color filter components and the separated microlens elements.

In some embodiments, a solid-state imaging device is provided. The solid-state imaging device includes a semiconductor substrate containing a plurality of photoelectric conversion elements. The solid-state imaging device also includes a color filter layer having a first color filter component and a second color filter component disposed above the semiconductor substrate. The first color filter component is separated from the second color filter component. The solid-state imaging device further includes a microlens structure having a first microlens element disposed on the first color filter component and a second microlens element disposed on the second color filter component. The first microlens element is separated from the second microlens element. In addition, the solid-state imaging device includes a gap between the first color filter component and the second color filter component and also between the first microlens element and the second microlens element. The gap is filled with air.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the contemplated mode of carrying out the invention. This description is made for the purpose of illustrating the general principles of the invention and should not be taken in a limiting sense. The scope of the invention is best determined by reference to the appended claims.

Figure 1:
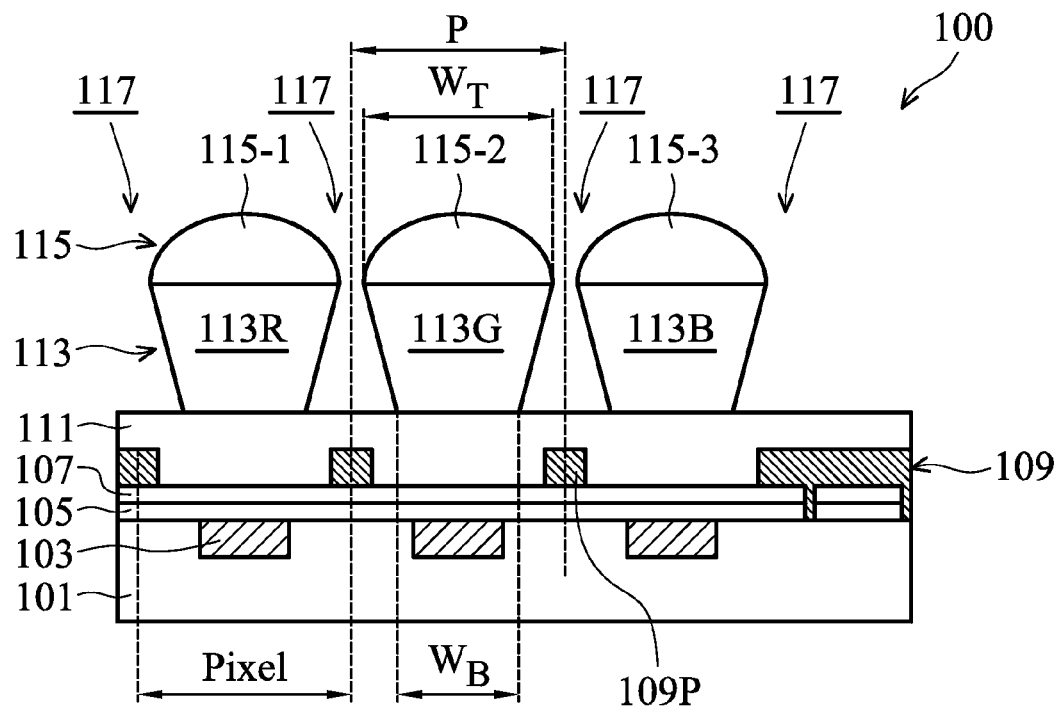
FIGS. 1-5 show schematic partial cross sections of solid-state imaging devices according to some embodiments.

Referring to FIG. 1, a partial cross section of a solid-state imaging device 100 according to some embodiments is shown. The solid-state imaging device 100 may be formed of a complementary metal-oxide semiconductor (CMOS) imaging sensor (CIS) or a charge coupled device (CCD) imaging sensor. The solid-state imaging device 100 includes a semiconductor substrate 101, for example a silicon wafer or a chip. The semiconductor substrate 101 contains a plurality of photoelectric conversion elements 103, such as photodiodes. Each of the photoelectric conversion elements 103 is disposed in one respective pixel of the solid-state imaging device 100. Moreover, the photoelectric conversion elements 103 are isolated from each other. Although FIG. 1 shows three pixels, actually the solid-state imaging device 100 has several million or more pixels.

The solid-state imaging device 100 can be a backside illumination (BSI) or a front-side illumination (FSI) imaging device. The back surface of the semiconductor substrate 101 has the photoelectric conversion elements 103 formed thereon. The front surface of the semiconductor substrate 101 has a wiring layer (not shown) of various wiring lines and electronic circuits required for the solid-state imaging device 100 formed thereon. In the BSI imaging device, the back surface of the semiconductor substrate 101 having the photoelectric conversion elements 103 is close to the light receiving surface of the solid-state imaging device 100. The front surface of the semiconductor substrate 101 having the wiring layer is far from the light receiving surface of the solid-state imaging device 100. In the FSI imaging device, the front surface of the semiconductor substrate 101 having the wiring layer formed thereon is close to the light receiving surface of the solid-state imaging device 100. The back surface of the semiconductor substrate 101 having the photoelectric conversion elements formed thereon is far from the light receiving surface of the solid-state imaging device 100.

As shown in FIGS. 1-5, in some embodiments, the solid-state imaging devices 100 can be BSI imaging devices which have photoelectric conversion elements 103 formed on the back surface of the semiconductor substrate 101 close to the light-receiving surface of the solid-state imaging devices 100. However, in some other embodiments, the solid-state imaging devices 100 can be FSI imaging devices.

As shown in FIG. 1, the solid-state imaging device 100 includes a high dielectric-constant (high-k) film 105 formed on the semiconductor substrate 101 and covering the photoelectric conversion elements 103. The material of the high-k film 105 includes hafnium oxide (HfO$_2$), hafnium tantalum oxide (HfTaO), hafnium titanium oxide (HfTiO), hafnium zirconium oxide (HfZrO), tantalum pentoxide (Ta$_2$O$_5$) or other suitable high-k dielectric materials. The high-k film 105 has a high-refractive index and a light-absorbing ability. The high-k film 105 can be formed by a deposition process.

The solid-state imaging device 100 also includes a buffer layer 107 formed on the high-k film 105. The buffer layer 107 can be used as an etch stop layer for subsequently forming a patterned light-shielding layer 109 on the buffer layer 107. The material of the buffer layer 107 includes silicon oxides, silicon nitrides, silicon oxynitrides, or other suitable insulating materials. The buffer layer 107 can be formed by a deposition process.

The light-shielding layer 109 includes a plurality of light-shielding partitions 109P formed on the buffer layer 107. From a top view, the light-shielding partitions 109P constitute a grid structure. In some embodiments, the material of the light-shielding layer 109 is a metal and the light-shielding partitions 109P can be referred to as a metal grid. The light-shielding partitions 109P are disposed between the pixels of the solid-state imaging device 100.

As shown in FIG. 1, in some embodiments, a passivation layer 111 is formed on and covers the light-shielding layer 109 and the buffer layer 107. The passivation layer 111 has a flat top surface. The material of the passivation layer 111 may include silicon oxides, silicon nitrides, silicon oxynitrides, and other suitable insulating materials. The passivation layer 111 can be formed by a deposition process. In some embodiments, the material of the passivation layer 111 is the same as that of the buffer layer 107. In some other embodiments, the material of the passivation layer 111 is different from that of the buffer layer 107.

A color filter layer 113 is formed on the flat top surface of the passivation layer 111. The color filter layer 113 includes a plurality of color filter components, such as a red (R) color filter component 113R, a green (G) color filter component 113G and a blue (B) color filter component 113B, disposed above the semiconductor substrate 101. According to the embodiments of the disclosure, the color filter components 113R, 113G and 113B are separated from each other by a gap 117 disposed between any two adjacent color filter components. The separated color filter components are arranged into an array. Thus, the color filter layer 113 can be referred to as an isolated color filter array and have a disconnected profile of color filter components. In some other embodiments, the color filter layer 113 further includes a white (W) color filter component (not shown). The color filter components 113R, 113G, 113B and the white (W) color filter component can be arranged in various styles, and these color filter components are separated from each other by a gap 117.

A microlens structure 115 includes a plurality of microlens elements, such as the microlens elements 115-1, 115-2 and 115-3, formed on the color filter layer 113. According to the embodiments of the disclosure, the microlens elements 115-1, 115-2 and 115-3 are separated from each other by a gap 117 disposed between any two adjacent microlens elements. The microlens elements 115-1, 115-2 and 115-3 are disposed on the color filter components 113R, 113G and 113B, respectively. The separated microlens elements are arranged into an array. Thus, the microlens structure 115 can be referred to as an isolated microlens array and have a disconnected profile of the microlens elements. In the embodiments, the gap 117 is disposed in both the color filter layer 113 and the microlens structure 115 to separate the adjacent color filter components and to separate the adjacent microlens elements. From a top view, the gap 117 has a grid shape corresponding to the shape of the light-shielding partitions 109P. The gap 117 can be referred to as a gap array.

In some embodiments, the gap 117 is filled with air and has a refractive index of about 1.0. The color filter components 113R, 113G, 113B usually have refractive indexes of about 1.6 to 1.8, but not limited to. In some embodiments of the disclosure, in order to enhance the overall performance of the color filter layer 113 or consider special requirements for the color filter layer 113, the color filter components 113R, 113G, 113B may have refractive indexes that are greater than 1.8 or less than 1.6. The refractive indexes of the color filter components 113R, 113G, 113B are higher than that of the gap 117 filled with air. The incident light entering the solid-state imaging device 100 is reflected totally in the color filter component of each pixel. As a result, the sensitivity of each pixel of the solid-state imaging device 100 is improved. The quantum efficiency (QE) of the solid-state imaging device 100 is thereby enhanced.

In the embodiments, the separated microlens elements and the separated color filter components can be formed of less material. Moreover, the separated microlens elements can be formed by coating, photolithography (exposure and development), and reflow processes. The fabrication cost of the reflow-type microlens elements is less than that of the microlens elements formed by coating, photolithography, and etch-back processes. Therefore, the fabrication cost of the solid-state imaging devices 100 according to the embodiments of the disclosure is reduced.

As shown in FIG. 1, in some embodiments, each of the color filter components 113R, 113G, 113B has a cross-section shaped like a trapezoid. The trapezoidal cross-section of the color filter component has a top width $W_T$ and a bottom width $W_B$. Each of the photoelectric conversion elements 103 is disposed in one respective pixel of the solid-state imaging device 100. One pixel of the solid-state imaging device 100 has a pixel width P. In the embodiments, y=the top width $W_T$/the bottom width $W_B$, x=the top width $W_T$/the pixel width P, and y=1.2x to 1.4x. Thus, in some embodiments, the cross-section of each of the color filter components 113R, 113G, 113B can be an inverted trapezoid which has a top width $W_T$ that is greater than the bottom width $W_B$ as shown in FIG. 1. In some other embodiments, the cross-section of each of the color filter components 113R, 113G, 113B can be a regular trapezoid which has a top width smaller than a bottom width.

Figure 2:
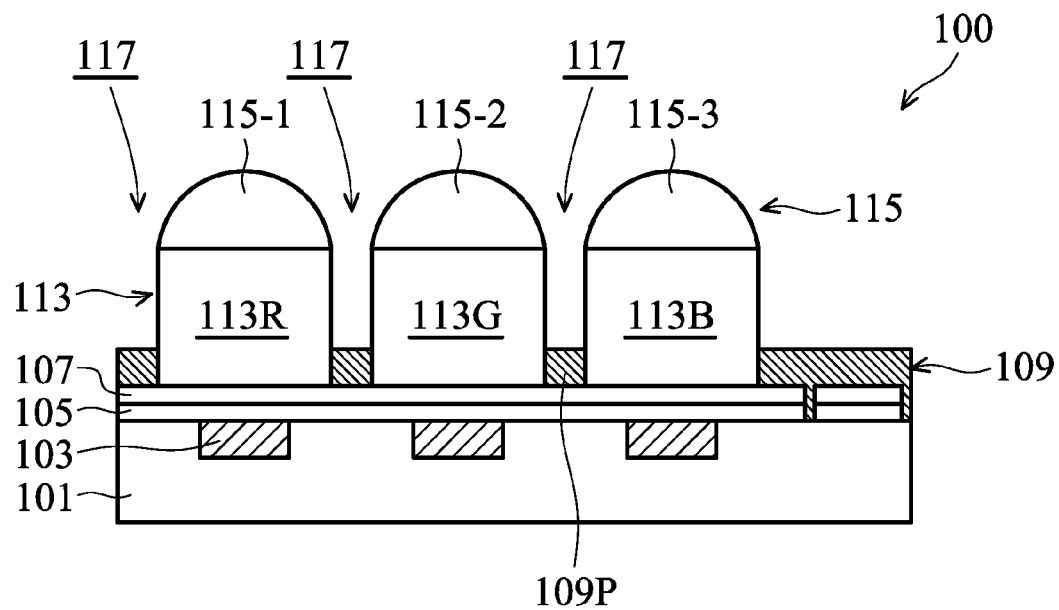

Referring to FIG. 2, a partial cross section of a solid-state imaging device 100 according to some embodiments is shown. As shown in FIG. 2, the color filter components 113R, 113G, 113B fill into a plurality of spaces between the light-shielding partitions 109P. The color filter components 113R, 113G, 113B are separated from each other by the light-shielding partitions 109P and the gap 117. In the embodiments, a portion of the space between the adjacent color filter components is filled with the light-shielding partitions 109P. The tops of the color filter components 113R, 113G, 113B are higher than the tops of the light-shielding partitions 109P. The gap 117 is filled with air and has a refractive index of about 1.0. The color filter components 113R, 113G, 113B have refractive indexes higher than that of the gap 117 filled with air. Thus, the incident light irradiating on each of the color filter component has a total reflection. The quantum efficiency (QE) of the solid-state imaging device 100 is thereby enhanced.

As shown in FIG. 2, the light-shielding partition 109P is disposed between any two adjacent color filter components. The color filter components 113R, 113G, 113B are disposed in the openings of the light-shielding layer 109. Each of the color filter components 113R, 113G, 113B has a rectangular cross-section. In some embodiments, there is no passivation layer covering the light-shielding layer 109. The color filter components 113R, 113G, 113B are directly formed on and in contact with the buffer layer 107. In some other embodiments, a passivation layer (not shown in FIG. 2) can be conformally formed on the light-shielding layer 109 to cover the sidewalls and the tops of the light-shielding partitions 109P.

In addition, the separated microlens elements 115-1, 115-2 and 115-3 are disposed on the separated color filter components 113R, 113G and 113B, respectively. The microlens elements 115-1, 115-2 and 115-3 are separated from each other by the gap 117. In the embodiments, the separated microlens elements 115-1, 115-2 and 115-3 have the same height. Also, the separated color filter components 113R, 113G and 113B have the same thickness. Thus, the separated color filter components 113R, 113G and 113B are level with each other. The separated microlens elements 115-1, 115-2 and 115-3 are also level with each other.

Figure 3:
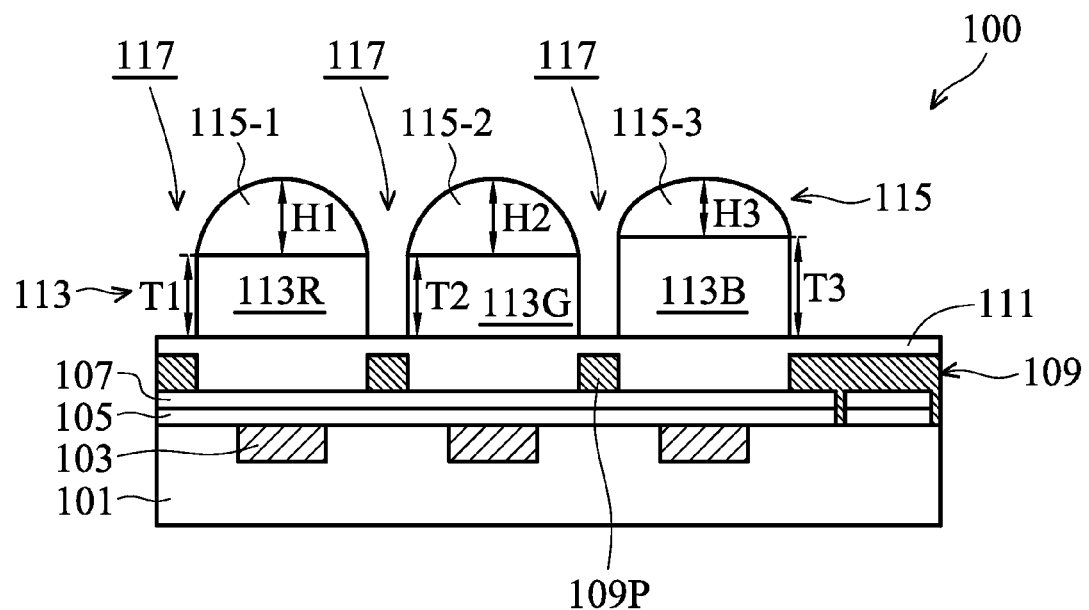

Referring to FIG. 3, a partial cross section of a solid-state imaging device 100 according to some embodiments is shown. In the embodiments, the passivation layer 111 is formed on the light-shielding layer 109 and the buffer layer 107. The passivation layer 111 has a flat top surface. The color filter components 113R, 113G and 113B are formed on the flat top surface of the passivation layer 111. Also, the color filter components 113R, 113G and 113B are separated from each other by a gap 117 filled with air. Thus, the color filter components 113R, 113G, 113B have refractive indexes higher than that of the gap 117 filled with air. The quantum efficiency (QE) of the solid-state imaging device 100 is thereby enhanced.

The microlens elements 115-1, 115-2 and 115-3 are also separated from each other by the gap 117. The separated microlens elements 115-1, 115-2 and 115-3 are disposed on the separated color filter components 113R, 113G and 113B, respectively. In the embodiments, the color filter component 113R has a thickness T1 that is the same as the thickness T2 of the color filter component 113G. The color filter component 113B has a thickness T3 that is greater than the thicknesses T1 and T2 of the color filter components 113R and 113G. The microlens element 115-1 has a height H1 that is the same as the height H2 of the microlens element 115-2. The microlens element 115-3 has a height H3 that is smaller than the heights H1 and H2 of the microlens elements 115-1 and 115-2. As a result, in some embodiments, the tops of the microlens elements 115-1, 115-2 and 115-3 are in the same level.

The heights H1, H2 and H3 of the microlens elements 115-1, 115-2 and 115-3 and the thicknesses T1, T2 and T3 of the color filter components 113R, 113G and 113B are based on the light path in the red, green and blue pixels. These heights H1, H2 and H3 and these thicknesses T1, T2 and T3 can be adjusted to achieve an optimal light path in the red, green and blue pixels. Therefore, the quantum efficiency (QE) of the red, green and blue pixels of the solid-state imaging device 100 is enhanced and optimized.

Figure 4:
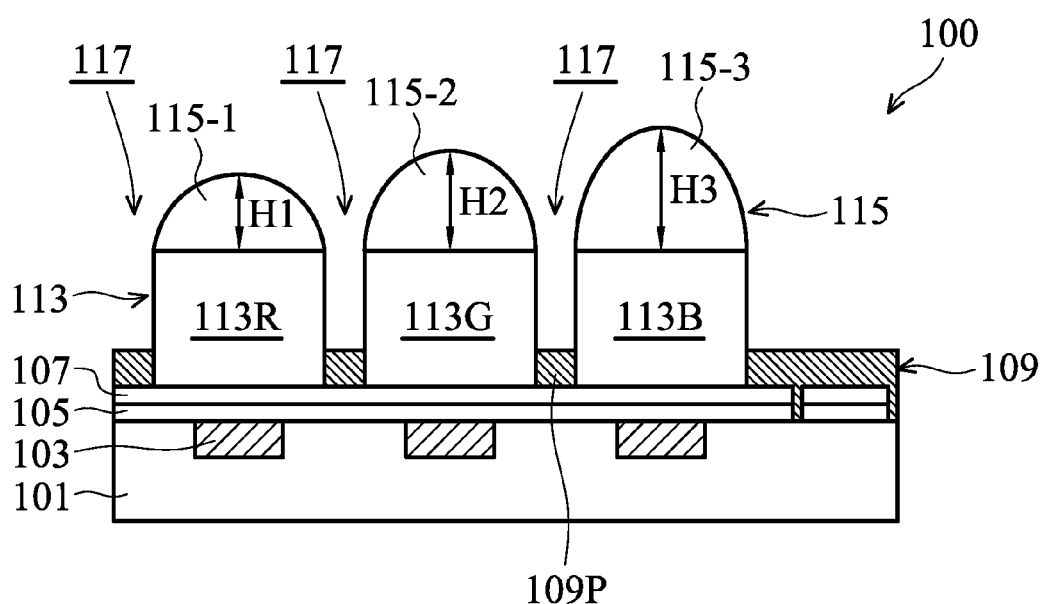

Referring to FIG. 4, a partial cross section of a solid-state imaging device 100 according to some embodiments is shown. In the embodiments, the color filter components 113R, 113G, 113B fill into a plurality of spaces between the light-shielding partitions 109P. The color filter components 113R, 113G, 113B are separated from each other by the light-shielding partitions 109P and the gap 117. The gap 117 is filled with air and has a refractive index of about 1.0. The color filter components 113R, 113G, 113B have refractive indexes higher than that of the gap 117 filled with air. The incident light irradiating on each of the color filter component has a total reflection. Thus, the quantum efficiency (QE) of the solid-state imaging device 100 is enhanced.

The microlens elements 115-1, 115-2 and 115-3 are also separated from each other by the gap 117. The separated microlens elements 115-1, 115-2 and 115-3 are disposed on the separated color filter components 113R, 113G and 113B, respectively. In the embodiments, the separated color filter components 113R, 113G and 113B have the same thickness. The separated microlens elements 115-1, 115-2 and 115-3 have different heights. As a result, the tops of the microlens elements 115-1, 115-2 and 115-3 are in different levels. The microlens elements 115-1, 115-2 and 115-3 have heights H1, H2 and H3, respectively. In some embodiments, the height H1 of the microlens element 115-1 in the red pixel is smaller than the height H2 of the microlens element 115-2 in the green pixel. The height H2 of the microlens element 115-2 in the green pixel is smaller than the height H3 of the microlens element 115-3 in the blue pixel. In some embodiments, the ratio of the height H1 to the height H2 to the height H3 is about 0.5:0.75:1. The heights H1, H2 and H3 of the microlens elements 115-1, 115-2 and 115-3 are based on the light path in the red, green and blue pixels. The heights H1, H2 and H3 can be adjusted to achieve an optimal light path in the red, green and blue pixels. Therefore, the quantum efficiency (QE) of the red, green and blue pixels of the solid-state imaging device 100 is enhanced and optimized.

In the embodiments, the microlens elements 115-1, 115-2 and 115-3 can be formed by coating, exposure, development and reflow processes. After the development process, the thicknesses of the materials for forming the microlens elements 115-1, 115-2 and 115-3 are different from each other. Thus, after the reflow process for shaping the microlens elements, the microlens elements 115-1, 115-2 and 115-3 have different heights of H1, H2 and H3, respectively. In some embodiments, the different heights H1, H2 and H3 of the microlens elements 115-1, 115-2 and 115-3 can be formed respectively by three repetitions of the process steps. In some other embodiments, the different heights H1, H2 and H3 of the microlens elements 115-1, 115-2 and 115-3 can be formed at the same time as the process steps. In the exposure process, different exposure amounts are applied in the red, green and blue pixels through the same mask with different patterns in the red, green and blue pixels. Thus, after the development process, the thicknesses of the materials for forming the microlens elements 115-1, 115-2 and 115-3 after are different from each other.

Figure 5:
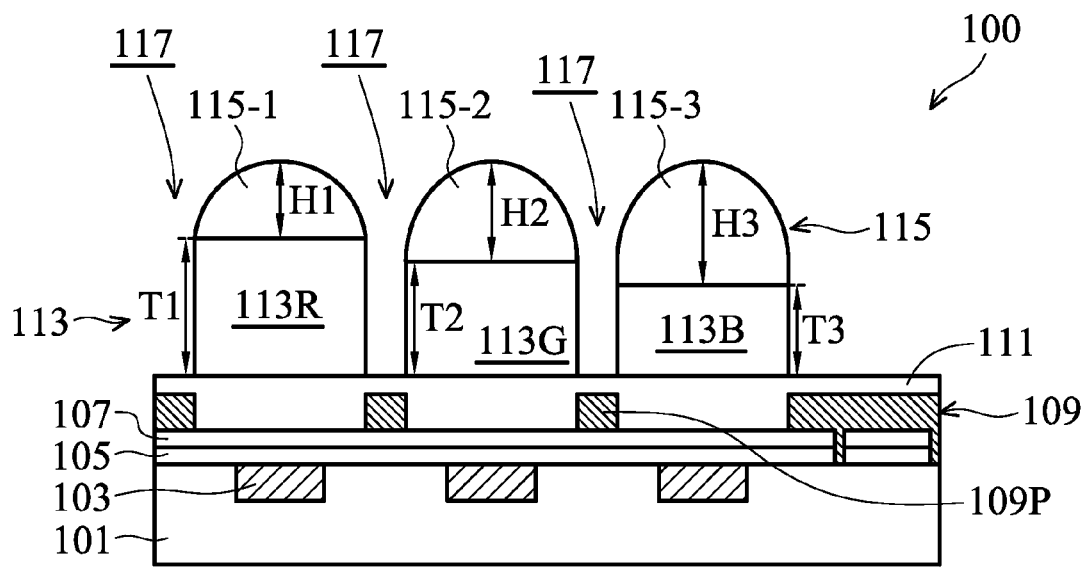

Referring to FIG. 5, a partial cross section of a solid-state imaging device 100 according to some embodiments is shown. In the embodiments, the passivation layer 111 is formed on the light-shielding layer 109 and the buffer layer 107. The passivation layer 111 has a flat top surface. The color filter components 113R, 113G and 113B are formed on the flat top surface of the passivation layer 111. Also, the color filter components 113R, 113G and 113B are separated from each other by a gap 117 filled with air. Thus, the color filter components 113R, 113G, 113B have refractive indexes higher than that of the gap 117 filled with air. The quantum efficiency (QE) of the solid-state imaging device 100 is thereby enhanced.

The microlens elements 115-1, 115-2 and 115-3 are also separated from each other by the same gap 117. The separated microlens elements 115-1, 115-2 and 115-3 are disposed on the separated color filter components 113R, 113G and 113B, respectively. In the embodiments, the separated color filter components 113R, 113G and 113B have different thicknesses of T1, T2 and T3, respectively. In some embodiments, the thickness T1 of the color filter component 113R in the red pixel is greater than the thickness T2 of the color filter component 113G in the green pixel. The thickness T2 of the color filter component 113G in the green pixel is greater than the thickness T3 of the color filter component 113B in the blue pixel.

In addition, the separated microlens elements 115-1, 115-2 and 115-3 have different heights of H1, H2 and H3, respectively. In some embodiments, the height H1 of the microlens element 115-1 in the red pixel is smaller than the height H2 of the microlens element 115-2 in the green pixel. The height H2 of the microlens element 115-2 in the green pixel is smaller than the height H3 of the microlens element 115-3 in the blue pixel. In some embodiments, the ratio of the height H1 to the height H2 to the height H3 is about 0.5:0.75:1. As a result, in some embodiments, the tops of the microlens elements 115-1, 115-2 and 115-3 are in the same level.

The heights H1, H2 and H3 of the microlens elements 115-1, 115-2 and 115-3 and the thicknesses T1, T2 and T3 of the color filter components 113R, 113G and 113B are based on the light path in the red, green and blue pixels. These heights H1, H2 and H3 and these thicknesses T1, T2 and T3 can be adjusted to achieve an optimal light path in the red, green and blue pixels. Therefore, the quantum efficiency (QE) of the red, green and blue pixels of the solid-state imaging device 100 is enhanced and optimized.

Figure 6:
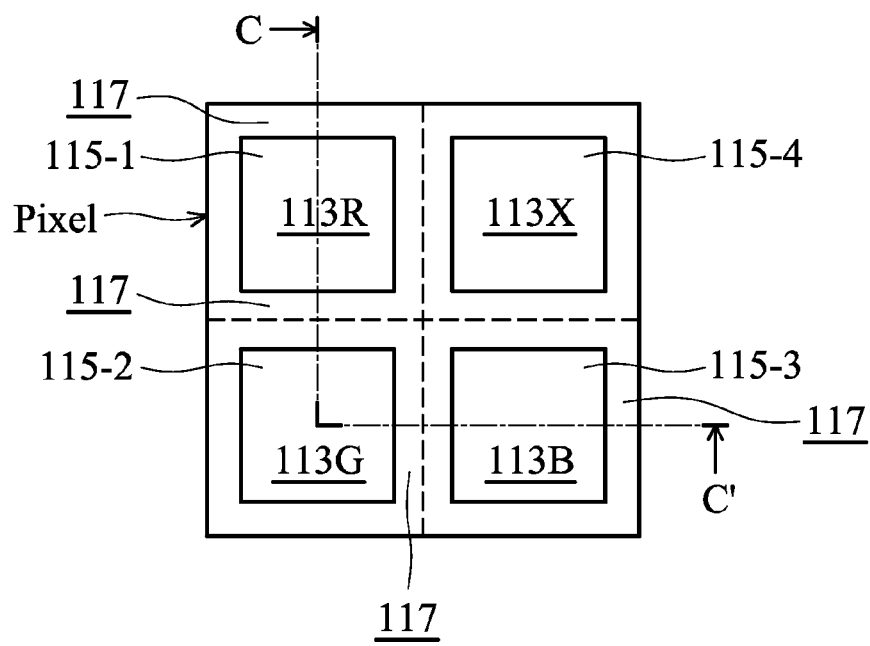
FIG. 6 shows a schematic partial plane view of a solid-state imaging device according to some embodiments.

Referring to FIG. 6, a partial plane view of a solid-state imaging device according to some embodiments is shown. The cross sections of the solid-state imaging devices 100 as shown in FIGS. 1-5 are taken along the cross section line C-C' of FIG. 6. As shown in FIG. 6, four pixels of the color filter components 113R, 113G and 113B and another color filter component 113X, such as a white color filter component or another green color filter component, constitute a repeat unit of the pixel array of the solid-state imaging devices 100. The four color filter components 113R, 113G, 113B and 113X are separated from each other by the gap 117. Moreover, four microlens elements 115-1, 115-2, 115-3 and 115-4 are disposed on the color filter components 113R, 113G, 113B and 113X, respectively. The microlens elements 115-1, 115-2, 115-3 and 115-4 are also separated from each other by the same gap 117. Each pixel of the solid-state imaging devices 100 has a pixel size. In some embodiments, the area of the gap 117 surrounding one respective color filter component 113R, 113G, 113B or 113X in each pixel is about 11% to about 21% of the pixel size. The dimension of the gap 117 can be adjusted by the photolithography process of forming the color filter components 113R, 113G, 113B and 113X.

According to the embodiments of the disclosure, the color filter components are separated from each other by a gap to form an isolated color filter array. The microlens elements disposed on the separated color filter components are also separated from each other by the same gap to form an isolated microlens array. The gap is filled with air, thus the refractive indexes of the color filter components are higher than that of the gap. As a result, the sensitivity such as the signal to noise ratio (SNR10) of each pixel of the solid-state imaging device is increased. The quantum efficiency (QE) of the solid-state imaging devices is also enhanced.

Moreover, the gap between the color filter components can prevent optical cross-talk from occurring in the adjacent pixels of the solid-state imaging devices. In addition, the fabrication cost of the solid-state imaging devices can be reduced by forming the separated color filter components and the separated microlens elements. Furthermore, the solid-state imaging devices of the embodiments can be used in BSI or FSI imaging sensors.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state imaging device, comprising:
   a semiconductor substrate containing a plurality of photoelectric conversion elements;
   a color filter layer including a first color filter component and a second color filter component disposed above the semiconductor substrate, wherein the first color filter component is separated from the second color filter component; and
   a microlens structure including a first microlens element disposed on the first color filter component and a second microlens element disposed on the second color filter component, wherein the first microlens element is separated from the second microlens element, the first color filter component has a thickness that is different from a thickness of the second color filter component, and the first microlens element has a height that is different from a height of the second microlens element; and
   a gap between the first and second color filter components and between the first and second microlens elements, wherein the gap is filled with air.

2. The solid-state imaging device as claimed in claim 1, wherein each of the first and second color filter components has a trapezoidal cross-section.

3. The solid-state imaging device as claimed in claim 2, wherein the trapezoid cross-section has a top width and a bottom width, each of the photoelectric conversion elements is disposed in one individual pixel, one pixel has a pixel width, y=the top width/the bottom width, x=the top width/the pixel width, and y=1.2x to 1.4x.

4. The solid-state imaging device as claimed in claim 1, wherein the color filter layer further includes a third color filter component, the third color filter component is separated from the first and second color filter components, the first, second and third color filter components are arranged into an array, a gap filled with air is disposed between the first, second and third color filter components and the gap has a grid shape.

5. The solid-state imaging device as claimed in claim 4, wherein the first, second and third color filter components have refractive indexes that are higher than the refractive index of the gap.

6. The solid-state imaging device as claimed in claim 4, wherein the microlens structure further includes a third microlens element disposed on the third color filter component, the third microlens element is separated from the first and second microlens elements, the first, second and third microlens elements are arranged into an array, a gap filled with air is disposed between the first, second and third microlens elements and the gap has a grid shape.

7. The solid-state imaging device as claimed in claim 1, wherein each of the first and second color filter components has a rectangular cross-section.

8. The solid-state imaging device as claimed in claim 7, wherein each pixel of the solid-state imaging device has a pixel size, the gap surrounding each of the first and second color filter components in each pixel has an area of 11%-21% of the pixel size.

9. The solid-state imaging device as claimed in claim 1, further comprising:
- a high dielectric-constant film formed on the semiconductor substrate;
- a buffer layer formed on the high dielectric-constant film; and
- a light-shielding layer including a plurality of light-shielding partitions foitiied on the buffer layer.

10. The solid-state imaging device as claimed in claim 9, further comprising a passivation layer covering the light-shielding layer and the buffer layer, wherein the passivation layer has a flat top surface.

11. The solid-state imaging device as claimed in claim 10, wherein the first and second color filter components are formed on the flat top surface of the passivation layer.

12. The solid-state imaging device as claimed in claim 9, wherein the first and second color filter components are formed on the buffer layer, the light-shielding partition is disposed between the first and second color filter components, and a portion of the gap between the first and second color filter components is filled with the light-shielding partition.

13. The solid-state imaging device as claimed in claim 1, wherein the first color filter component has a thickness that is the same as a thickness of the second color filter component, and the top of the first microlens element is lower than or higher than the top of the second microlens element.

14. The solid-state imaging device as claimed in claim 1, wherein the top of the first microlens element is level with the top of the second microlens element.

15. The solid-state imaging device as claimed in claim 1, wherein the microlens structure further includes a third microlens element, the color filter layer further includes a third color filter component, the third microlens element is disposed on the third color filter component, and the third microlens element has a height that is different from the heights of the first and second microlens elements.

16. The solid-state imaging device as claimed in claim 15, wherein the first, second and third color filter components are red, green and blue color filter components, respectively, the height of the first microlens element on the red color filter component is smaller than the height of the second microlens element on the green color filter component, and the height of the second microlens element on the green color filter component is smaller than the height of the third microlens element on the blue color filter component.

17. The solid-state imaging device as claimed in claim 16, wherein the ratio of the height of the first microlens element to the heights of the second and third microlens elements is 0.5:0.75:1.

18. The solid-state imaging device as claimed in claim 1, wherein the first and second microlens elements are reflow-type microlens formed by coating, photolithography and reflow processes.

19. The solid-state imaging device as claimed in claim 1, comprising a back-side illumination (BSI) imaging sensor or a front-side illumination (FSI) imaging sensor.

* * * * *